United States Patent
Tokutome et al.

(10) Patent No.: US 7,035,366 B2
(45) Date of Patent: Apr. 25, 2006

(54) DELAY LOCKED LOOP CIRCUIT AND ITS CONTROL METHOD

(75) Inventors: Hiroto Tokutome, Tokyo (JP); Seiji Sawada, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 757 days.

(21) Appl. No.: 10/166,123

(22) Filed: Jun. 11, 2002

(65) Prior Publication Data

US 2003/0012321 A1 Jan. 16, 2003

(30) Foreign Application Priority Data

Jul. 12, 2001 (JP) .......................... P2001-212296

(51) Int. Cl.
*H04L 7/00* (2006.01)
*H03D 3/24* (2006.01)
*H03L 7/06* (2006.01)
*H03L 7/00* (2006.01)

(52) U.S. Cl. .................. 375/371; 375/375; 375/376; 327/146; 327/153

(58) Field of Classification Search .............. 375/376, 375/373, 371, 354, 294, 293, 215, 214, 327, 375/375; 327/144–149, 155–158, 141, 151; 370/516, FOR. 177; 714/700

See application file for complete search history.

(56) References Cited

U.S. PATENT DOCUMENTS

| | | | | |
|---|---|---|---|---|
| 5,610,938 A | * | 3/1997 | Kokaji | 375/142 |
| 5,783,956 A | * | 7/1998 | Ooishi | 327/157 |
| 5,886,946 A | * | 3/1999 | Ooishi | 365/233 |
| 5,892,797 A | * | 4/1999 | Deng | 375/361 |
| 5,973,525 A | * | 10/1999 | Fujii | 327/158 |
| 6,081,145 A | * | 6/2000 | Bandai et al. | 327/231 |
| 6,111,442 A | * | 8/2000 | Aulet et al. | 327/156 |
| 6,125,157 A | * | 9/2000 | Donnelly et al. | 375/371 |
| 6,215,726 B1 | * | 4/2001 | Kubo | 365/233 |
| 6,342,796 B1 | * | 1/2002 | Jung | 327/141 |
| 6,373,913 B1 | * | 4/2002 | Lee | 375/376 |
| 6,445,234 B1 | * | 9/2002 | Yoon et al. | 327/161 |
| 6,525,988 B1 | * | 2/2003 | Ryu et al. | 365/233 |
| 6,901,013 B1 | * | 5/2005 | Jones et al. | 365/194 |

* cited by examiner

*Primary Examiner*—Tesfaldet Bocure
*Assistant Examiner*—Vineeta S. Panwalkar
(74) *Attorney, Agent, or Firm*—McDermott Will & Emery LLP (57) ABSTRACT

A delay locked loop (DLL) circuit comprising: a fundamental phase comparator for detecting a fundamental phase difference of two input signals; a delay circuit; a delay control circuit for adjusting a delay time of the delay circuit in response to an output signal of the fundamental phase comparator; and at least one further phase comparator for detecting a phase difference other than the fundamental phase difference such that an amount of change of the delay time is changed in accordance with the fundamental phase difference.

16 Claims, 8 Drawing Sheets

| CNT | /RMV | ADD | EMG | UP |
|---|---|---|---|---|
| L | H | L | L | L |
| L | L | L, H | H | L |
| H | L, H | H | H | H |
| H | H | L | L | H |
| L | H | H | INDEFINITE | INDEFINITE |
| H | L | L | INDEFINITE | INDEFINITE |

DELAY LOCKED LOOP CIRCUIT AND ITS CONTROL METHOD

BACKGROUND OF THE INVENTION

1. Field of the Invention

The present invention relates to a delay locked loop (DLL) circuit and its control method.

2. Description of the Prior Art

Figure 12:
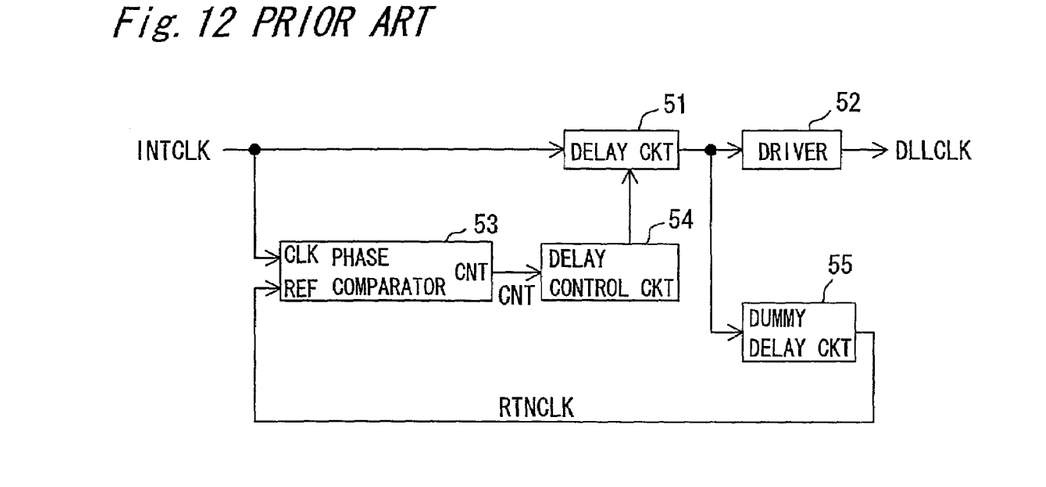
FIG. 12 is a block diagram showing a configuration of a prior art DLL circuit.
Figure 13:
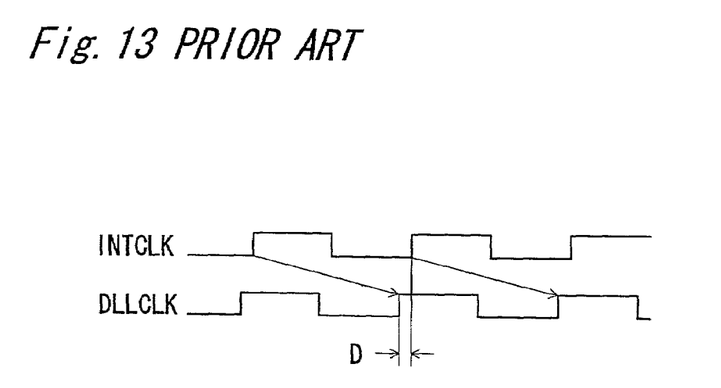
FIG. 13 is a timing chart explanatory of operation of the prior art DLL circuit of FIG. 12.

FIG. 12 shows an example of a configuration of a conventional DLL circuit. The conventional DLL circuit includes a delay circuit 51, a driver 52, a phase comparator 53, a delay control circuit 54 and a dummy delay circuit 55. In FIG. 12, the phase comparator 53 compares a phase of an input clock INTCLK with a phase of a feedback clock RTNCLK which has passed through the delay circuit 51 and the dummy delay circuit 55 and outputs its comparison signal CNT to the delay control circuit 54. In response to the comparison signal CNT, the delay control circuit 54 adjusts delay time of the delay circuit 51. As shown in FIG. 13, the conventional DLL circuit of FIG. 12 performs a function of keeping a phase difference D between the input clock INTCLK and an output clock DLLCLK constant by the above described feedback circuit.

Figure 14A:
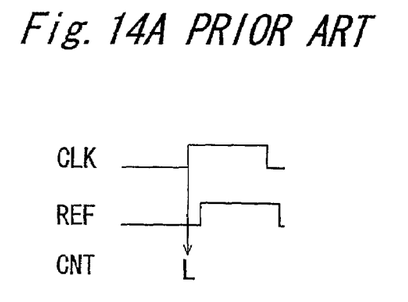
FIGS. 14A and 14B are timing charts explanatory of operation of a phase comparator employed in the prior art DLL circuit of FIG. 12.
Figure 14B:
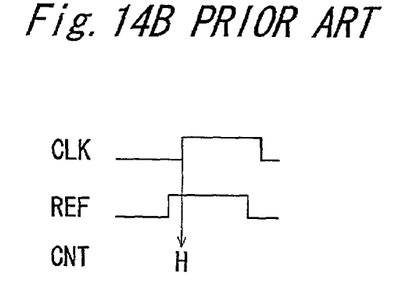

Operational examples of the phase comparator 53 of the conventional DLL circuit of FIG. 12 are shown in FIGS. 14A and 14B, respectively. In case a reference clock signal REF is low at a rise edge of a clock signal CLK as shown in FIG. 14A, the comparison signal CNT is set to low state. On the other hand, in case the reference clock signal REF is high at the rise edge of the clock signal CLK as shown in FIG. 14B, the comparison signal CNT is set to high state. Timing for switching low state and high state of the comparison signal CNT is determined by the rise edges of the clock signal CLK. The delay time of the delay circuit 51 is increased or reduced by the comparison signal CNT.

Figure 15:
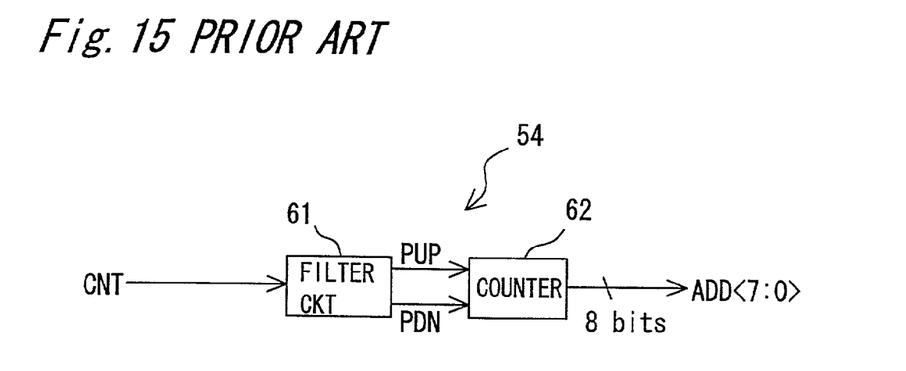
FIG. 15 is a block diagram showing a configuration of a delay control circuit employed in the prior art DLL circuit of FIG. 12.

A configuration of the delay control circuit 54 of the conventional DLL circuit of FIG. 12 is shown in FIG. 15. The delay control circuit 54 includes a filter circuit 61 and a counter 62. Initially, the comparison signal CNT from the phase comparator 53 is inputted to the filter circuit 61, Only when the comparison signal CNT is kept constant for not less than a predetermined period, the filter circuit 61 generates signals PUP and PDN for commanding increase and decrease of actual delay time, respectively. This is because in case the phase difference is converged to a target value in the phase comparator 53, it is supposed that the comparison signal CNT frequently changes between high state and low state. In this case, since it is not necessary to change the delay time expressly, the delay time is not changed unless the comparison signal CNT is kept constant for not less than the predetermined period.

The counter 62 performs count operation in response to the signals PUP and PDN and outputs, for example, an address signal ADD<7:0> having an 8-bit width from an address "7" to an address "0". Namely, when the signal PUP is high, the address signal ADD<7:0> increases. On the contrary, when the signal PDN is high, the address signal ADD<7:0>decreases. Finally, the address signal ADD<7:0> is outputted from the counter 62 to the delay circuit 51. The address signal ADD<7:0> inputted to the delay circuit 51 is decoded and is used for changeover of a switch for determining whether or not an actual delay step is used.

Figure 16:
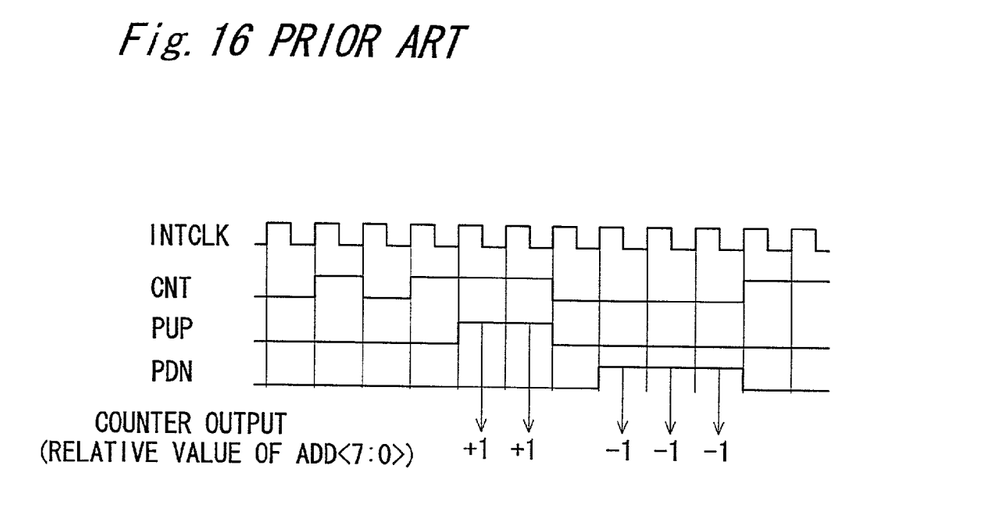
FIG. 16 is a timing chart explanatory of operation of the delay control circuit of FIG. 15.

FIG. 16 is a timing chart explanatory of operation of the delay control circuit 54 of the conventional DLL circuit. In timing in a leftward portion of FIG. 16, since the comparison signal CNT frequently changes between high state and low state, the signals PUP and PDN are not outputted. Namely, the signals PUP and PDN are set to low state. Then, in timing in a middle portion of FIG. 16, since the comparison signal CNT is continuously held in high state, for example, for not less than twice a period of the input clock INTCLK, the signal PUP is outputted. Namely, the signal PUP is set to high state and the signal PDN is set to low state. Furthermore, in timing in a rightward portion of FIG. 16, since the comparison signal CNT is continuously held in low state, for example, for not less than twice the period of the input clock INTCLK, the signal PDN is outputted. Namely, the signal PUP is set to low state and the signal PDN is set to high state.

In the above described conventional DLL circuit, such a disadvantage is incurred that although the delay time of the delay circuit 51 is a preset default value in an initial state at the time of turning on of a power source and changes from the default value so as to be shortly converged to a desired delay time, i.e., "locked", a long time is required for locking the delay time. Thus, in, for example, a double data rate synchronous DRAM (DDRSDRAM), since such a product specification that locking of a delay time should be completed within 200 cycles from an initial state is provided, various configurations of the DDRSDRAM are proposed.

SUMMARY OF THE INVENTION

Accordingly, an essential object of the present invention is to provide, with a view to eliminating the above mentioned drawbacks of prior art DLL circuits, a DLL circuit in which a time period up to locking of a delay time is shortened and its control method.

In order to accomplish this object of the present invention, a delay locked loop (DLL) circuit according to the present invention comprises: a fundamental phase comparator for detecting a fundamental phase difference of two input signals; a delay circuit; a delay control circuit for adjusting a delay time of the delay circuit in response to an output signal of the fundamental phase comparator; and at least one further phase comparator for detecting a phase difference other than the fundamental phase difference such that an amount of change of the delay time is changed in accordance with the fundamental phase difference.

BRIEF DESCRIPTION OF THE DRAWINGS

This object and features of the present invention will become apparent from the following description taken in conjunction with the preferred embodiments thereof with reference to the accompanying drawings in which.

Before the description of the present invention proceeds, it is to be noted that like parts are designated by like reference numerals throughout several views of the accompanying drawings.

DETAILED DESCRIPTION OF THE INVENTION

Hereinafter, embodiments of the present invention are described with reference to the drawings.

FIRST EMBODIMENT

Figure 1:
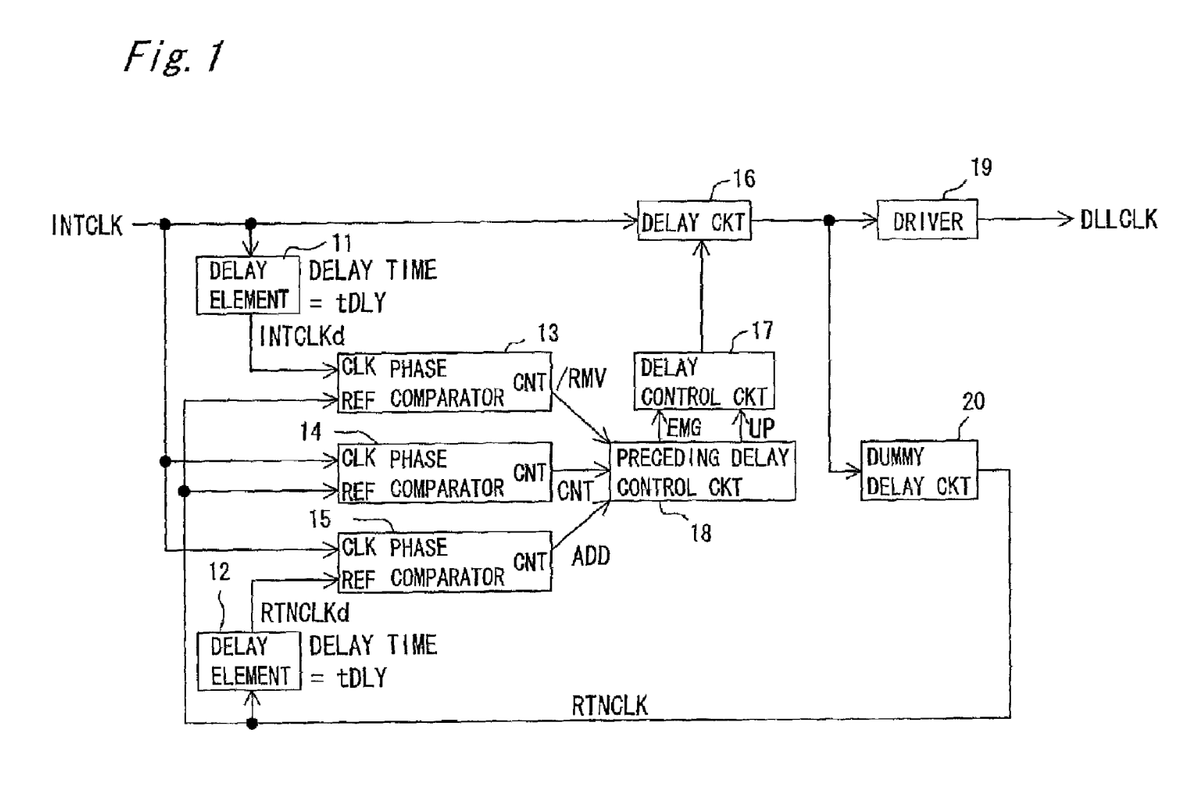
FIG. 1 is a block diagram showing a configuration of a DLL circuit according to a first embodiment of the present invention.

FIG. 1 shows a configuration of a delay locked loop (DLL) circuit according to a first embodiment of the present invention. The DLL circuit of FIG. 1 includes a first delay element 11 having a delay time tDLY, a second delay element 12 having the delay time tDLY, a first phase comparator 13 operatively associated with the first delay element 11, a second phase comparator 14, a third phase comparator 15 operatively associated with the second delay element 12, a delay circuit 16, a delay control circuit 17, a preceding delay control circuit 18, a driver 19 and a dummy delay circuit 20. In FIG. 1, the second phase comparator 14 corresponds to a phase comparator 53 of a prior art DLL circuit of FIG. 12. Thus, the DLL circuit of FIG. 1 can be obtained by adding to the prior art DLL circuit of FIG. 12 the first and third phase comparators 13 and 15 for detecting two phase differences different from that of the second phase comparator 14, respectively and the preceding delay control circuit 18.

The first, second and third phase comparators 13, 14 and 15 are identical with one another but receive input signals having different phase differences (delay times), respectively. The first phase comparator 13 compares a phase of a signal INTCLKd obtained by retarding an input clock INTCLK the delay time tDLY by the first delay element 11 and a phase of a feedback clock RTNCLK and outputs its comparison signal /RMV to the preceding delay control circuit 18. In the same manner as the phase comparator 53 of the prior art DLL circuit of FIG. 12, the second phase comparator 14 compares a phase of the input clock INTCLK and the phase of the feedback clock RTNCLK and outputs its comparison signal CNT to the preceding delay control circuit 18. Meanwhile, the third phase comparator 15 compares the phase of the input clock INTCLK and a phase of a signal RTNCLKd obtained by retarding the feedback clock RTNCLK the delay time tDLY by the second delay element 12 and outputs its comparison signal ADD to the preceding delay control circuit 18.

Figure 2A:
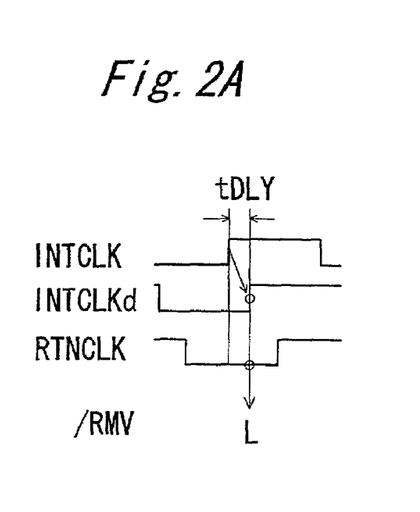
FIGS. 2A and 2B are timing charts explanatory of operation of a first phase comparator employed in the DLL circuit of FIG. 1.
Figure 2B:
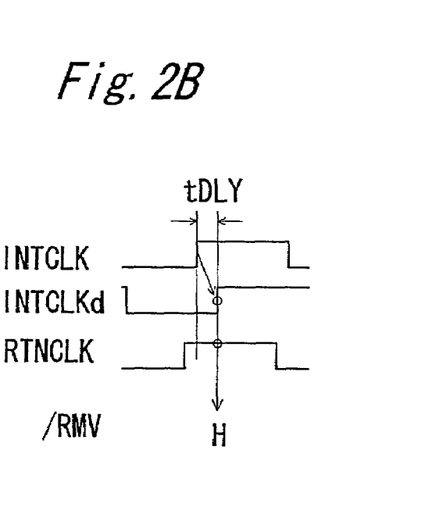

Operation of the first phase comparator 13 is illustrated in FIGS. 2A and 2B. In case the feedback clock RTNCLK is low at a rise edge of the signal INTCLKd as shown in FIG. 2A, the comparison signal /RMV is set to low state. On the other hand, in case the feedback clock RTNCLK is high at the rise edge of the signal INTCLKd as shown in FIG. 2B, the comparison signal /RMV is set to high state.

Figure 3A:
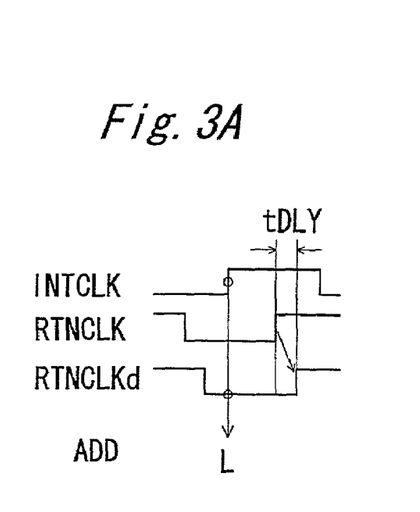
FIGS. 3A and 3B are timing charts explanatory of operation of a third phase comparator employed in the DLL circuit of FIG. 1.
Figure 3B:
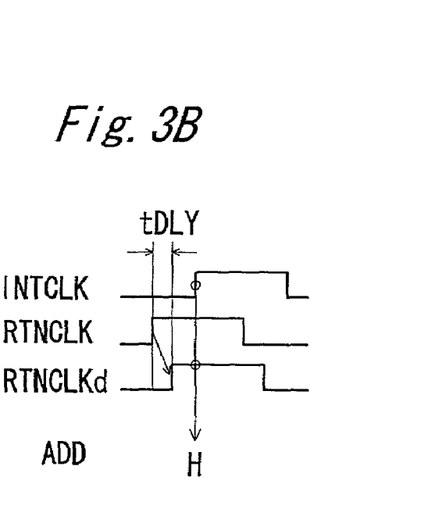

Meanwhile, operation of the third phase comparator 15 is illustrated in FIGS. 3A and 3B. In case the signal RTNCLKd is low at a rise edge of the input clock INTCLK as shown in FIG. 3A, the comparison signal ADD is set to low state. On the contrary, in case the signal RTNCLKd is high at the rise edge of the input clock INTCLK as shown in FIG. 3B, the comparison signal ADD is set to high state. Since operation of the second phase comparator 14 is similar to that of the conventional phase comparator 53, which is shown in FIGS. 14A and 14B, the description is abbreviated for the sake of brevity.

In response to the comparison signals /RMV, CNT and ADD from the first, second and third phase comparators 13, 14 and 15, the preceding delay control circuit 18 outputs to the delay control circuit 17 a signal EMG (emergency) indicative of magnitude of an amount of change of the delay time and a signal UP indicative of increase and decrease of the delay time.

Figure 4:
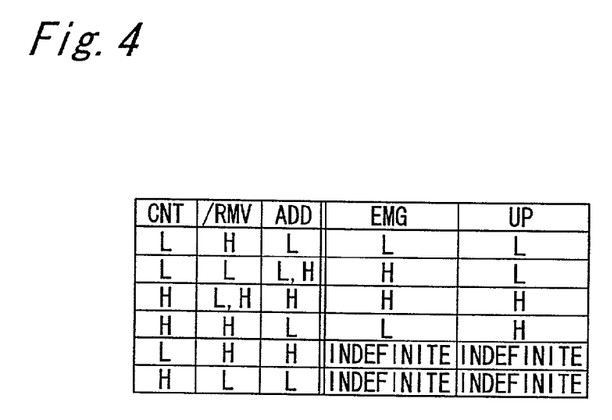
FIG. 4 is a view showing relation between input signals and output signals of a preceding delay control circuit employed in the DLL circuit of FIG. 1.

Supposing that the delay time tDLY is sufficiently small in comparison with a pulse width of a clock signal CLK and the preceding delay control circuit 18 operates, for example, as shown in FIG. 4, it is defined by combination of the comparison signals /RMV, CNT and ADD that (1) when the signal EMG is low and the signal UP is high, the delay time is increased and the amount of change of the delay time is small, (2) when the signal EMG is low and the signal UP is low, the delay time is reduced and the amount of change of the delay time is small, (3) when the signal EMG is high and the signal UP is high, the delay time is increased and the amount of change of the delay time is large and (4) when the signal EMG is high and the signal UP is low, the delay time is reduced and the amount of change of the delay time is large. Meanwhile, if the delay time tDLY is sufficiently small in comparison with the pulse width of the clock signal CLK, combinations "indefinite" of the signals EMG and UP in FIG. 4 do not occur.

In the DLL circuit of FIG. 1, two phase comparators, i.e., the first and third phase comparators 13 and 15 are added to the second phase comparator 14 but only one of the first and third phase comparators 13 and 15 may also be added to the second phase comparator 14. However, in this case, since one of the comparison signals /RMV and ADD is not inputted to the preceding delay control circuit 18, a portion of combinations of the input signals /RMV, CNT and ADD and the output signals EMG and UP for the preceding delay control circuit 18 is eliminated from FIG. 4, so that a portion of the above mentioned functions (1) to (4) of the preceding delay control circuit 18 is not performed.

In this embodiment, the delay control circuit 17 receives the signals EMG and UP from the preceding delay control circuit 18 and is capable of changing the amount of change of the delay time in accordance with the phase difference. Thus, in case an absolute value of the phase difference becomes not less than a predetermined value, the amount of change of the delay time can be increased. As a result, in case the phase difference is large, for example, by turning on a power source, the phase difference can be converged to a predetermined value rapidly.

SECOND EMBODIMENT

Figure 5:
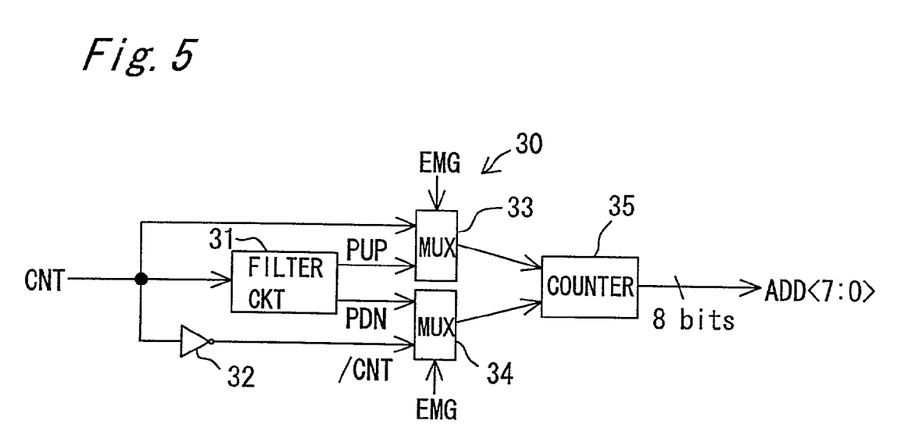
FIG. 5 is a block diagram showing a configuration of a delay control circuit employed in a DLL circuit according to a second embodiment of the present invention.

FIG. 5 shows a configuration of a delay control circuit 30 employed in a DLL circuit according to a second embodiment of the present invention. This DLL circuit is obtained by replacing the delay control circuit 17 of the DLL circuit of the first embodiment in FIG. 1 with the delay control circuit 30. The delay control circuit 30 includes a filter circuit 31, a NOT circuit 32, multiplexers 33 and 34 and a counter 35. The counter 35 outputs, for example, an address signal ADD<7:0> having an 8-bit width from an address "7" to an address "0". When the signal EMG is low, the multiplexers 33 and 34 output to the counter 35 signals PUP and PDN from the filter circuit 31, respectively. On the other hand, when the signal EMG is high, the multiplexers 33 and 34 output, by skipping the filter circuit 31, directly to the counter 35 the comparison signal CNT and a signal /CNT obtained by passing the comparison signal CNT through the NOT circuit 32, respectively.

In this embodiment, when the signal EMG is high, namely, the phase difference is large, change of the delay time can be performed rapidly by skipping the filter circuit 31.

THIRD EMBODIMENT

A third embodiment of the present invention is directed to a control method of the DLL circuit of the first embodiment or the second embodiment, in which the DLL circuit is actuated only at the time of resetting of the DLL circuit. Resetting of the DLL circuit is based on an external command for reinstating the delay time of the DLL circuit to a default value. A product specification provides that resetting of the DLL circuit should be carried out without fail at the time of turning on of a power source. Namely, when the DLL circuit of the first embodiment or the second embodiment has been reset, there is a strong possibility that the phase difference in the phase comparator becomes large, so that the DLL circuit is enabled. On the contrary, when the DLL circuit of the first embodiment or the second embodiment is held in stable state, the DLL circuit is disabled.

Figure 6:
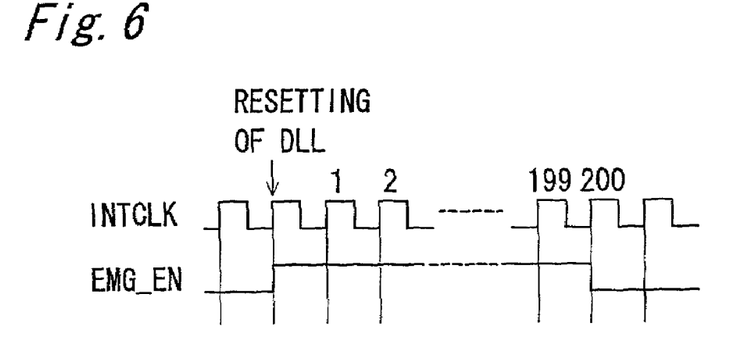
FIG. 6 is a timing chart explanatory of operation of signals in a DLL circuit control method according to a third embodiment of the present invention.

As shown in FIG. 6, supposing that the DLL circuit is in stable state, for example, at and after 200 cycles from resetting of the DLL circuit and "EMG_EN" denotes a control signal, the control signal EMG_EN may be set to high state during a period of 200 cycles from resetting of the DLL circuit. The number of the cycles may be counted by using, for example, a counter or the like.

In the DLL circuit of the first embodiment, the control signal EMG_EN controls operation of the first and second delay elements 11 and 12 for producing the signals INTCLKd and RTNCLKd, respectively, operation of the first and third phase comparators 13 and 15 and judgement on the signal EMG in the preceding delay control circuit 18. Meanwhile, in the DLL circuit of the second embodiment, the control signal EMG_EN causes the preceding delay control circuit 18 to judge the signal EMG only at the time of resetting of the DLL circuit such that it is determined whether or not the filter circuit 31 should be skipped.

In this embodiment, it is possible to prevent inadvertent malfunctions of the DLL circuit operating stably. Moreover, by eliminating unnecessary operation of the DLL circuit functioning stably, such an effect is gained that power consumption can be restrained.

FOURTH EMBODIMENT

A fourth embodiment of the present invention is directed to a control method of the DLL circuit of the first embodiment or the second embodiment, in which the DLL circuit is actuated only when the DLL circuit is in active mode. When the DLL circuit is in active mode, load of the power source may vary due to actuation of an array, so that the phase difference in the phase comparator may become large. Thus, only when the DLL circuit of the first embodiment or the second embodiment is in active mode, the DLL circuit is enabled. On the contrary, when the DLL circuit of the first embodiment or the second embodiment is in standby mode, the DLL circuit is disabled.

Figure 7:
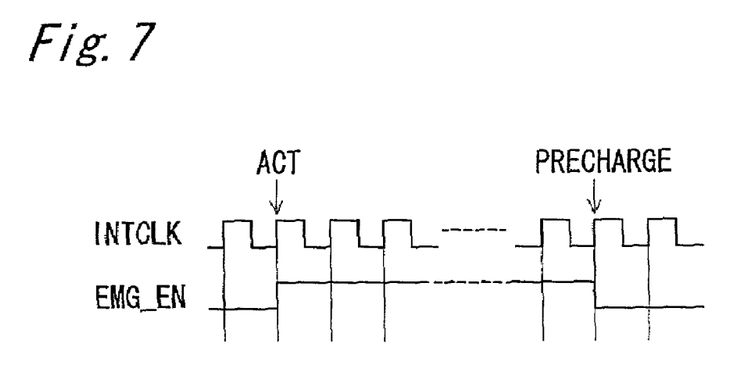
FIG. 7 is a timing chart explanatory of operation of signals in a DLL circuit control method according to a fourth embodiment of the present invention.

As shown in FIG. 7, active mode of the DLL circuit occupies, for example, a period from production of an act command ACT to production of a precharge command PRECHARGE and the control signal EMG_EN may be set to high state only during this period. In this embodiment, the DLL circuit of the first embodiment or the second embodiment is controlled by the control signal EMG_EN in the same manner as the third embodiment.

In this embodiment, it is possible to prevent inadvertent malfunctions of the DLL circuit in standby mode. Furthermore, by eliminating unnecessary operation of the DLL circuit in standby mode, such an effect is achieved that power consumption can be restrained.

FIFTH EMBODIMENT

A fifth embodiment of the present invention is directed to a control method of the DLL circuit of the first embodiment or the second embodiment, in which the DLL circuit is provided in a semiconductor device having a reading function, for example, a semiconductor memory unit such that the DLL circuit is actuated only at the time of reading of the semiconductor memory unit. The DLL circuit generates clocks for determining timing of output data. Namely, accuracy of the DLL circuit may be judged only at the time of reading of the semiconductor memory unit. Thus, only at the time of reading of the semiconductor memory unit, the DLL circuit of the first embodiment or the second embodiment is enabled. On the other hand, when the semiconductor memory unit is not performing reading, the DLL circuit of the first embodiment or the second embodiment is disabled.

Figure 8:
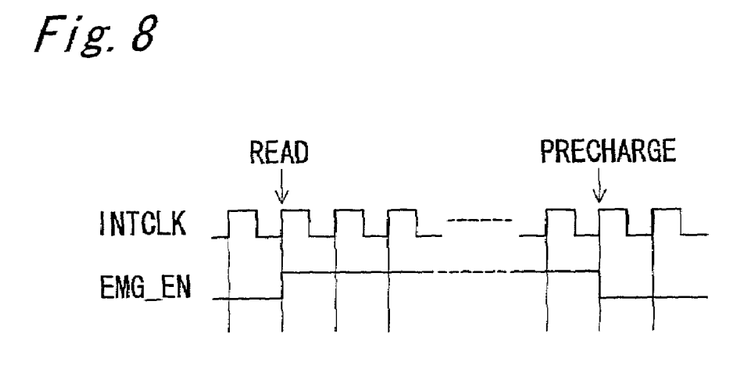
FIG. 8 is a timing chart explanatory of operation of signals in a DLL circuit control method according to a fifth embodiment of the present invention.

As shown in FIG. 8, reading operation occupies, for example, a period from production of a reading command READ to production of a precharge command PRECHARGE and the control signal EMG_EN may be set to high state only during this period. In this embodiment, the DLL circuit of the first embodiment or the second embodiment is controlled by the control signal EMG_EN in the same manner as the third embodiment.

In this embodiment, it is possible to prevent inadvertent malfunctions of the DLL circuit when the DLL circuit is not performing reading. Furthermore, by eliminating unnecessary operation of the DLL circuit when the DLL circuit is not performing reading, such an effect is achieved that power consumption can be restrained.

SIXTH EMBODIMENT

Figure 9:
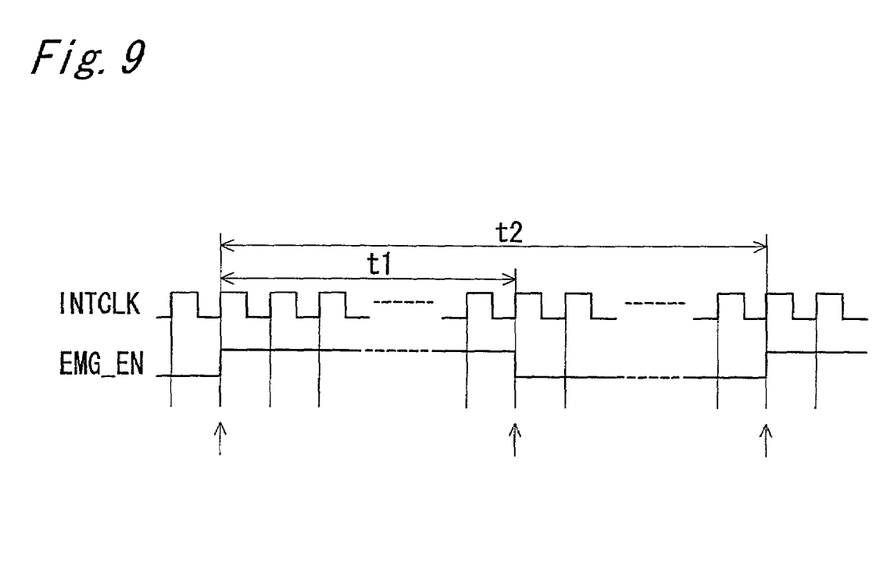
FIG. 9 is a timing chart explanatory of operation of signals in a DLL circuit control method according to a sixth embodiment of the present invention.

A sixth embodiment of the present invention is directed to a control method of the DLL circuit of the first embodiment or the second embodiment, in which by providing an internal timer circuit, the DLL circuit is actuated at a predetermined interval set by the internal timer circuit. Namely, as shown in FIG. 9, a period t1 during which the control signal EMG_EN is high and an operational period t2 of the control signal EMG_EN can be set by the internal timer circuit. In this embodiment, the DLL circuit of the first embodiment or the second embodiment is controlled by the control signal EMG_EN in the same manner as the third embodiment.

In this embodiment, it is possible to adjust balance between power consumption upon actuation of the DLL circuit of the first embodiment or the second embodiment and response characteristics of the DLL circuit.

SEVENTH EMBODIMENT

Figure 10:
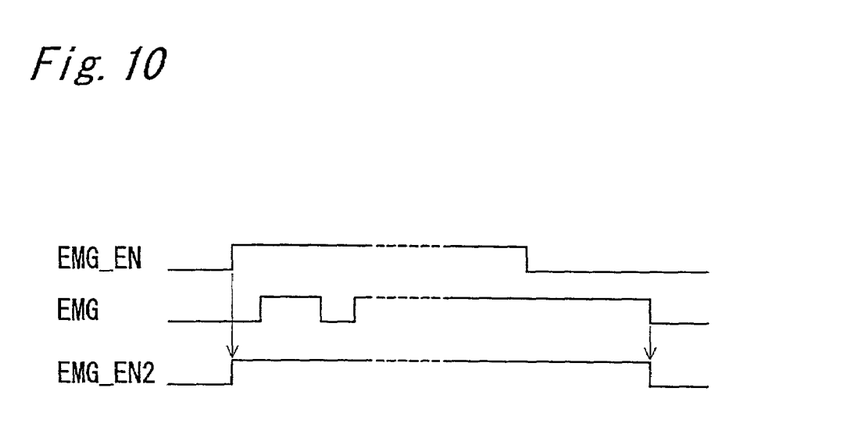
FIG. 10 is a timing chart explanatory of operation of signals in a DLL circuit control method according to a seventh embodiment of the present invention.

A seventh embodiment of the present invention is directed to a control method of the DLL circuit of the first embodiment or the second embodiment, in which in the third to sixth embodiments, when it has been detected that the phase difference is large, namely, the signal EMG is high, operation of the DLL circuit is continued until it is not detected that the phase difference is large, namely, until the signal EMG becomes low. As shown in FIG. 10, a signal EMG_EN2 is generated by the control signal EMG_EN and the signal EMG which are generated in the third to sixth embodiments. Namely, at the same time when the control signal EMG_EN becomes high, the signal EMG_EN2 is set to high state. Meanwhile, even if the control signal EMG EN becomes low, the signal EMG_EN2 does not become low and maintains high state until the signal EMG becomes low. This signal EMG_EN2 may be inputted in place of the control signal EMG_EN.

In this embodiment, it is possible to solve such a problem that in the third to sixth embodiments, the DLL circuit of the first embodiment or the second embodiment is not actuated upon lapse of the respective predetermined periods regardless of magnitude of the phase difference.

EIGHTH EMBODIMENT

An eighth embodiment of the present invention is directed to a control method of the DLL circuit of the first embodiment, in which the delay time tDLY is changed in accordance with an operational period tCLK.

Figure 11A:
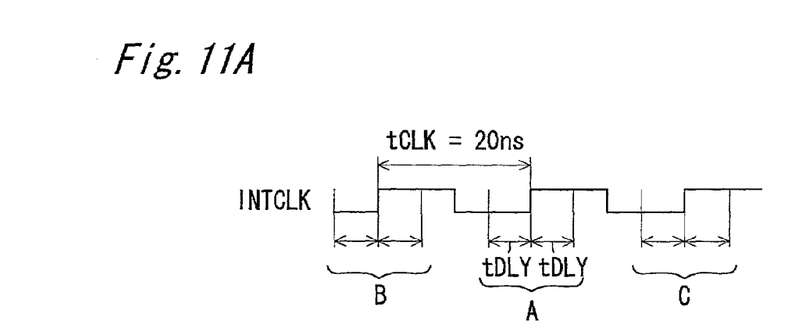
FIGS. 11A and 11B are waveform diagrams of an input clock, in which a delay time is fixed in a DLL circuit.
Figure 11B:
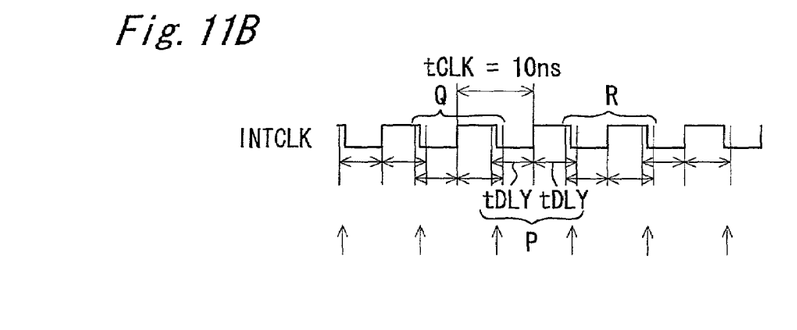

In the first embodiment, the delay time tDLY of the first and second delay elements 11 and 12 is fixed. Here, such cases are considered in which relative to the delay time tDLY fixed at 6 ns, the operational period tCLK is large, for example, 20 ns as shown in FIG. 11A and is small, for example, 10 ns as shown in FIG. 11B. It can be said that in the first embodiment, an amount of change of the delay time, which is available when a deviation of the feedback clock RTNCLK from the input clock INTCLK is smaller than the delay time tDLY, is made different from that available when the deviation is larger than the delay time tDLY. Namely, in the first embodiment, the amount of change of the delay time is changed in accordance with whether or not an edge of the feedback clock RTNCLK falls in a range of ($\pm$tDLY) from a rise edge of the input clock INTCLK in FIGS. 11A and 11B.

In case the operational period tCLK is large relative to the delay time tDLY as shown in FIG. 11A, a range A of ($\pm$tDLY) from one rise edge of the input clock INTCLK does not overlap a range B of ($\pm$tDLY) from the preceding rise edge of the input clock INTCLK and a range C of ($\pm$tDLY) from the subsequent rise edge of the input clock INTCLK. However, in case the operational period tCLK is small relative to the delay time tDLY, a range P of ($\pm$tDLY) from one rise edge of the input clock INTCLK overlaps a range Q of ($\pm$tDLY) from the preceding rise edge of the input clock INTCLK and a range R of ($\pm$tDLY) from the subsequent rise edge of the input clock INTCLK as shown by the arrows in FIG. 11B, so that it is difficult to control the DLL circuit at this time.

In this embodiment, the delay time tDLY is changed in accordance with the operational period tCLK. To this end, an operational period detector for detecting the operational period tCLK may be used such that the delay time tDLY is changed on the basis of detection result of the operational period detector.

In this embodiment, since the delay time tDLY is changed in accordance with the operational period tCLK, the phase difference required for actuating the first and third phase comparators 13 and 15 can be optimized even if the operational period tCLK changes.

NINTH EMBODIMENT

A ninth embodiment of the present invention is directed to a control method of the DLL circuit of the first embodiment, in which the DLL circuit is provided in a semiconductor device having a reading function, for example, a semiconductor memory unit such that the delay time tDLY is changed in accordance with a column address strobe (CAS) latency of the semiconductor memory unit in place of the operational period tCLK of the eighth embodiment. The CAS latency represents the number of clock cycles counted during a period from issue of a reading command READ of data to output of the data. Generally, as the CAS latency is larger, the DLL circuit can be actuated by further lessening the operational period tCLK. The problem resulting from reduction of the operational period tCLK is described above in the eighth embodiment.

In this embodiment, the delay time tDLY is changed in accorance with the CAS latency. To this end, the delay time tDLY may be changed on the basis of a signal generated by setting the CAS latency In this embodiment, since the delay time tDLY is changed in accordance with the CAS latency, the delay time tDLY can be optimized more easily than the eighth embodiment.

What is claimed is:
1. A delay locked loop (DLL) circuit comprising:
 a first delay circuit for delaying an internal clock signal according to a delay time;
 a first phase comparator for detecting a first phase difference between the internal clock signal from the first delay circuit and a reference clock signal;
 a second phase comparator, including a second delay circuit for delaying the reference clock signal, for detecting a second phase difference between the internal clock signal from the first delay circuit and the delayed reference clock signal;
 a third phase comparator, including a third delay circuit for delaying the internal clock signal from the first delay circuit, for detecting a third phase difference between the delayed internal clock signal and the reference clock signal; and delay control circuit for adjusting the delay time of the first delay circuit based on the first, second and third phase differences; and 2. A DLL circuit according to claim 1, wherein the delay control circuit includes a filter circuit, a counter and a multiplxer which is provided between the filter circuit and the counter so as to cause the filter circuit to be skipped in accordance with the first, second, and third phase differences.

3. A method of controlling a delay locked loop (DLL) circuit, comprising the steps of:
   delaying an internal clock signal according to a delay time;
   detecting a first phase difference between a reference clock signal and the internal clock signal fed through a feedback loop;
   delaying the reference clock signal, and detecting a second phase difference between the delayed reference clock signal and the internal clock signal fed through the feedback loop;
   delaying the internal clock signal fed through the feedback loop, and detecting a third phase difference between the reference clock signal and the delayed internal clock signal; and
   adjusting the delay time based on the first, second and third phase differences.

4. A method according to claim 3, wherein the DLL circuit is actuated only when the DLL circuit has been reset.

5. A method according to claim 3, wherein the DLL circuit is actuated only when the DLL circuit is in active mode.

6. A method according to claim 3, wherein the DLL circuit is provided in a semiconductor device having a reading function and the DLL circuit is actuated only at the time of reading of the semiconductor device.

7. A method according to claim 3, wherein the DLL circuit is actuated at a predetermined interval set by using an internal timer.

8. A method according to claim 3, wherein when it has been detected that the first phase difference is large, the DLL circuit is actuated until it is not detected that the first phase difference is large.

9. A method according the claim 3, wherein a delay time of delaying the reference clock signal and delaying the internal clock signal fed through the feedback loop is changed in accordance with an operational period.

10. A method according to claim 3, wherein the DLL circuit is provided in a semiconductor device having a reading function and a delay time of delaying the reference clock signal and delaying the internal clock signal fed through the feedback loop is changed in accordance with a column address strobe (CAS) latency of the semiconductor device.

11. A method of controlling a delay locked loop (DLL) circuit including a delay control circuit having a filter circuit filtering a signal from a phase comparator, the method comprising the steps of:
   detecting a first phase difference between a reference clock signal and an internal clock signal fed through a feedback loop;
   delaying the reference clock signal, and detecting a second phase difference between the delayed reference clock signal and the internal clock signal fed through the feedback loop;
   delaying the internal clock signal fed through the feedback loop, and detecting a third phase difference between the reference clock signal and the delayed internal clock signal; and
   directing a signal indicating the first phase difference to bypass the filter in accordance with the first, second and third phase differences.

12. A method according to claim 11, wherein the DLL circuit is actuated only when the DLL circuit has been reset.

13. A method according to claim 11, wherein the DLL circuit is actuated only when the DLL circuit is in active mode.

14. A method according to claim 11, wherein the DLL circuit is provided in a semiconductor device having a reading function and the DLL circuit is actuated only at the time of reading of the semiconductor device.

15. A method according to claim 11, wherein the DLL circuit is actuated at a predetermined interval set by using an internal timer.

16. A method according to claim 11, wherein when it has been detected that the first phase difference is large, the DLL circuit is actuated until it is not detected that the first phase difference is large.

* * * * *